United States Patent
Hu et al.

(10) Patent No.: US 11,970,392 B2
(45) Date of Patent: Apr. 30, 2024

(54) SELF-PACKING THREE-ARM THERMAL SCANNING PROBE FOR MICRO-NANO MANUFACTURING

(71) Applicant: ZHEJIANG UNIVERSITY, Zhejiang (CN)

(72) Inventors: Huan Hu, Zhejiang (CN); Renwei Mao, Zhejiang (CN)

(73) Assignee: ZHEJIANG UNIVERSITY, Zhejiang (CN)

( * ) Notice: Subject to any disclaimer, the term of this patent is extended or adjusted under 35 U.S.C. 154(b) by 0 days.

(21) Appl. No.: 17/767,904

(22) PCT Filed: Jun. 18, 2021

(86) PCT No.: PCT/CN2021/100920
§ 371 (c)(1),
(2) Date: Apr. 10, 2022

(87) PCT Pub. No.: WO2022/007651
PCT Pub. Date: Jan. 13, 2022

(65) Prior Publication Data
US 2024/0002220 A1    Jan. 4, 2024

(30) Foreign Application Priority Data
Jul. 10, 2020 (CN) .......................... 202010662491.1

(51) Int. Cl.
*G01Q 70/10* (2010.01)
*B81C 99/00* (2010.01)
(Continued)

(52) U.S. Cl.
CPC ......... *B81C 99/0025* (2013.01); *G01Q 70/10* (2013.01); *G01Q 70/14* (2013.01); *G01Q 80/00* (2013.01)

(58) Field of Classification Search
CPC .... B81C 99/0025; G01Q 70/10; G01Q 70/14; G01Q 80/00
See application file for complete search history.

(56) References Cited

U.S. PATENT DOCUMENTS

| | | | | |
|---|---|---|---|---|
| 4,089,575 A | * | 5/1978 | Grabbe | ................ H05K 7/1046 174/541 |
| 6,509,217 B1 | * | 1/2003 | Reddy | ................. H01L 29/4908 438/210 |
| 2018/0217183 A1 | * | 8/2018 | Ivankin | ................. G03F 9/7061 |

* cited by examiner

*Primary Examiner* — Nicole M Ippolito
(74) *Attorney, Agent, or Firm* — Law Office of Oliver Edwards LLC; Oliver Edwards

(57) ABSTRACT

The present disclosure discloses a self-packing three-arm thermal scanning probe for micro-nano manufacturing, comprising: a three-arm cantilever beam, metal contact pads, a nichrome heating electrode for printing, a nichrome heating electrode for transportation, and a polymer storage area. The present disclosure is manufactured by conventional micro-nano machining processes such as lithography and wet etching. In the present disclosure, a gradient density design of heating electrodes is used to generated continuous change of temperature gradients, thus realizing continuous transportation of a printing material from a storage area to a tip area, which realizes self-packing. The present disclosure can be seamlessly integrated with a CMOS process, and a printed material can be completely eliminated by means of commonly used acetone or oxygen plasma in the CMOS process, without contamination; furthermore, the micro-nano machining method of the present disclosure only requires an atomic force microscope whose cost is very low.

1 Claim, 3 Drawing Sheets

(51) Int. Cl.
*G01Q 70/14* (2010.01)
*G01Q 80/00* (2010.01)

SELF-PACKING THREE-ARM THERMAL SCANNING PROBE FOR MICRO-NANO MANUFACTURING

TECHNICAL FIELD

The present disclosure belongs to the technical field of micro-nano manufacturing, and particularly relates to a self-packing three-arm thermal scanning probe for micro-nano manufacturing.

BACKGROUND ART

Controllable and repeatable manufacturing is the core issue in a Nano-Electro-Mechanical System (NEMS) and is also an important reason of limiting its wide application in the fields of information technology, medical health, environmental energy, national defense and military, and the like. One of the main technical difficulties is how to simultaneously achieve high-precision, low-cost, and nano-machining process integrated with a complementary metal oxide semiconductor (CMOS) circuit process. An ideal manufacturing method of the NEMS requires the characteristics of high speed, high reliability, low cost, convenience of use, small damage to materials, real-time monitoring for machining results, and the like. Compared with the current mainstream nano machining process, such as electron beam lithography, focused ion etching, nano imprinting, deep ultraviolet lithography, etc., a scanning probe-based nano machining method has the advantages of high precision and small contamination, depends on an atomic force microscope with a relatively low cost, compared to other nano machining equipment, has the degree of freedom of machining any shapes, and has a greater possibility of mass production.

The scanning probe-based machining technology uses a scanning probe and a substrate to interact with each other in a local nano-scale area, thus realizing micro-nano machining. According to the type of a microscope used, there can be a scanning probe machining process using a scanning tunneling microscope and a scanning probe machining technology using an atomic force microscope. The main advantage of the scanning probe machining technology using the scanning tunneling microscope is that the atomic accuracy can be achieved, but the speed is extremely low, and it is far from being suitable for the manufacturing of nano-electro-mechanical devices. The scanning probe machining technology based on the atomic force microscope is faster, and no vacuum environment is required in most cases. The technology is easy to operate and more suitable for the machining of nano-electro-mechanical devices.

In a variety of scanning probe-based micro-nano machining technologies that use the atomic force microscope platforms, an additive thermal scanning probe-based machining method currently shows great potential in the manufacturing of the NEMS. The main principle of this technology is to print, through a heatable atomic force microscope probe, a molten polymer onto a semiconductor material substrate through a nano tip at a free end of the probe, and then use a printed polymer nanostructure as an etching mask, and transfer the polymer nanostructure onto a semiconductor substrate material through one-step substrate etching, such as silicon or graphene, so as to realize the manufacturing of silicon and graphene nano structures of the semiconductor material. More importantly, this method can be seamlessly integrated with the CMOS process, since the printed material can be completely eliminated by acetone or oxygen plasma commonly used in the CMOS process, without contamination.

Existing thermal probes all use a silicon cantilever beam itself as a heating electrode. Two different silicon doping steps are generally required. Different silicon doping concentrations means different resistance values, which in turn leads to different heating gradients. The polymer manually added to the tip area will be melt at about 300 DEG C. and be transported from the tip to a normal-temperature substrate, so that the polymer is rapidly cooled and solidified and remains on the substrate. The shape of the printed polymer is determined by a motion trajectory of a thermal probe, and the motion trajectory of the probe of the atomic force microscope platform can be controlled by software to realize printing of any shape. However, this kind of thermal probe is based on the doped silicon. Two-step oxidization, lithography, etching, and ion implantation are required during the manufacturing. How to more accurately control the surface temperature gradient distribution to realize self-packing accurate, continuous printing of the molten polymer in a micro-nano printing process is still a big technical difficulty.

SUMMARY

The present disclosure aims to provide a self-packing three-arm thermal scanning probe for micro-nano manufacturing for the deficiencies in the existing art.

The purpose of the present disclosure is achieved by the following technical solution: A self-packing three-arm thermal scanning probe for micro-nano manufacturing, comprising: a three-arm cantilever beam, metal contact pads, nichrome heating electrodes for printing, a nichrome heating electrode for transportation, and a polymer storage area. The three-arm cantilever beam is E shape; two outer cantilever beams are printing cantilever beams, and middle cantilever beam is a transportation cantilever beam; a probe tip is located in an area that connects three cantilever beams and on an extending line of the transportation cantilever beam; the polymer storage area is located at an other end of the transportation cantilever beam relative to the probe tip; the transportation cantilever beam is provided with the nichrome heating electrode for transportation, exhibiting S shape, and is used for heating the polymer storage area; the nichrome heating electrode for transportation is distributed to become sparse from the polymer storage area to the probe tip, thus forming a temperature gradient continuously changing from high to low along the transportation cantilever beam, so that a molten polymer flows to the probe tip; the printing cantilever beams and the area that connects the three cantilever beams are provided with nichrome heating electrode for printing, which are uniformly distributed in an S-shape, and are used for heating the probe tip, so that the polymer flowing to the probe tip remains in a liquid state; four metal contact pads in total are arranged in on two sides of the three-arm cantilever beam and in gaps among the three cantilever beams and are used for supplying power to the heating electrodes; two metal contact pads on the two sides of the three-arm cantilever beam are respectively connected to two ends of the nichrome heating electrode for printing to form a loop; and other two metal contact pads in the gaps between the three cantilever beams are respectively connected to two ends of the nichrome heating electrode for transportation to form a loop.

The present invention has the beneficial effects: The self-packing micro-nano printing is realized by using the design of the gradient heating electrodes, and the technical difficulties that the current thermal probe cannot continuously print a micro-nano structure will be broken through, so as to improve the stability, the reliability, and the continuity of micro-nano machining; nano electro-mechanical devices of 1-2 microns and 10-100 nanometers and even structures with the precision of 10 nanometers or below can be printed and manufactured by changing the size of the tip, the type of the polymer and the temperature gradient and controlling the printing speed; and the present disclosure can be seamlessly integrated with the CMOS process and has the characteristics of low cost and simple usage.

BRIEF DESCRIPTION OF THE DRAWINGS

The present disclosure is further described below in combination with the accompanying drawings and embodiments.

Figure 1:
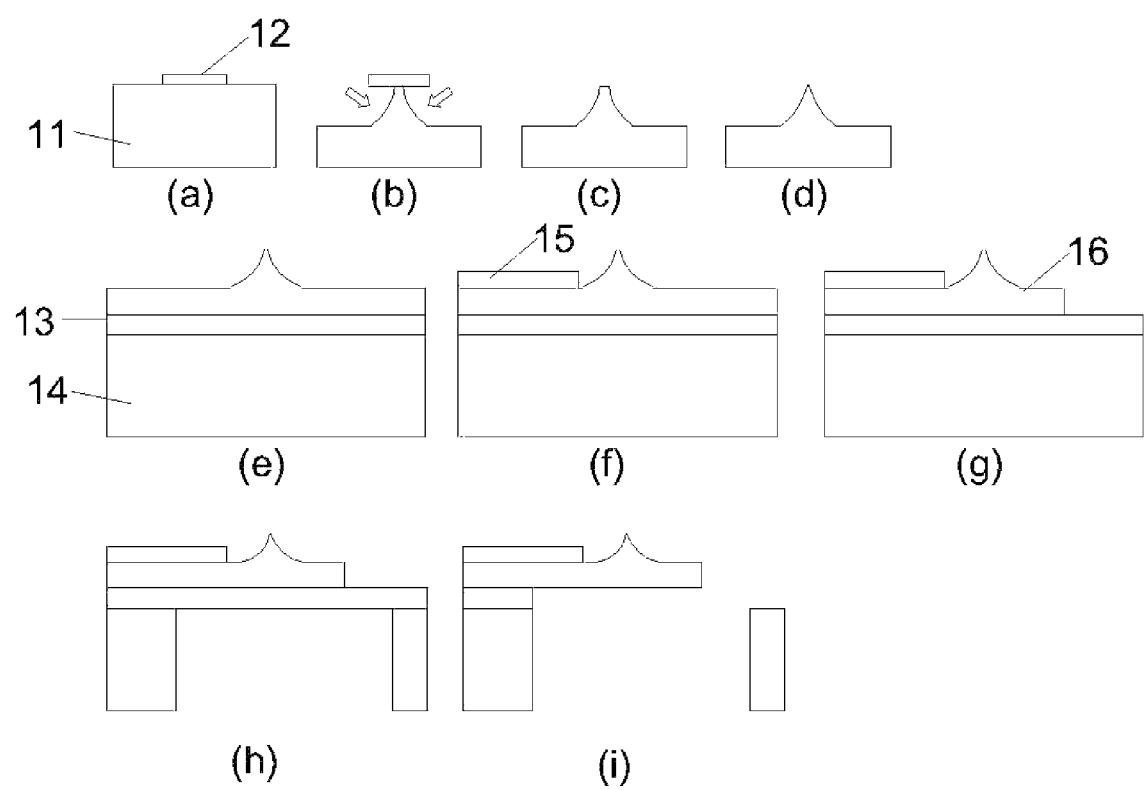
FIG. 1 is a schematic diagram of a three-arm thermal probe manufacturing method of the present disclosure.

In the drawings: 11 silicon on insulator (SOI) top-layer monocrystalline silicon; 12 silicon nitride protective layer; 13 silicon dioxide; 14 SOI bottom-layer monocrystalline silicon; nichrome electrode; 16 three-arm cantilever beam; 21 probe tip; 22 metal contact pad; 23 nichrome heating electrode for printing; 24 nichrome heating electrode for transportation; 26 molten polymer; 27 polymer storage area; 34 metal electrode; 35 two-dimensional material; 36 three-arm self-packing thermal probe; and 37 polymer mask.

DETAILED DESCRIPTION OF THE EMBODIMENTS

The present disclosure discloses a self-packing three-arm thermal scanning probe for micro-nano manufacturing. A gradient density design of heating electrodes is used to generate continuous change of temperature gradients, thus realizing continuous transportation of a printing material from a storage area to a tip area, which can realize low-cost real-time self-packing high-precision micro-nano printing.

A manufacturing method of a self-packing three-arm thermal scanning probe for micro-nano manufacturing includes the following steps.

As shown in FIG. 1, a silicon nitride mask that is about 2×2 microns is manufactured on an SOI silicon wafer; wet isotropic corrosion is then performed to manufacture a preliminary tip; and after the mask is removed, a radius of a top end of the tip is further reduced by means of silicon oxidization and hydrofluoric acid corrosion. A nichrome thin film is manufactured around the tip area by using traditional methods of lithography, electron beam evaporation and photoresist lift-off in sequence, and cantilever beams are finally manufactured by using an SOI substrate-based process, specifically as follows.

(1.1) As shown in FIG. 1(a), an SOI silicon wafer is used as a raw material, and lithography, sputtering and photoresist lift-off processes are sequentially performed on a surface of an SOI top-layer monocrystalline silicon 11 to manufacture a silicon nitride protective layer 12.

(1.2) As shown in FIG. 1(b), the SOI top-layer monocrystalline silicon 11 is etched by an isotropic wet etching method to obtain a preliminary tip; as shown in FIG. 1(c), the silicon nitride protective layer 12 is removed; as shown in FIG. 1(d), the preliminary tip on the SOI top-layer monocrystalline silicon 11 is further etched by using silicon oxidization and hydrofluoric acid in sequence, to obtain a final probe tip 21.

(1.3) FIG. 1(e) illustrates the SOI silicon wafer with the completed probe tip 21; as shown in FIG. 1(f), a metal thin film of a nichrome electrode 15 is manufactured on a surface of the SOI top-layer monocrystalline silicon 11 by using traditional methods of lithography, electron beam evaporation and photoresist lift-off in sequence.

(1.4) As shown in FIG. 1(g), the SOI top-layer monocrystalline silicon 11 is etched to be E-shaped, to obtain a three-arm cantilever beam 16.

(1.5) As shown in FIG. 1(h), an SOI bottom-layer monocrystalline silicon 14 is subjected to back lithography; a desired area is subjected to deep silicon etching till the silicon dioxide 13, i.e., a sacrificial layer part, in the middle of the SOI silicon wafer is exposed.

(1.6) As shown in FIG. 1(a), the exposed silicon dioxide layer 13 is corroded with the hydrofluoric acid, so that the three-arm cantilever beam 16 is released, thus finally obtaining the three-arm thermal scanning probe 36.

Figure 2:
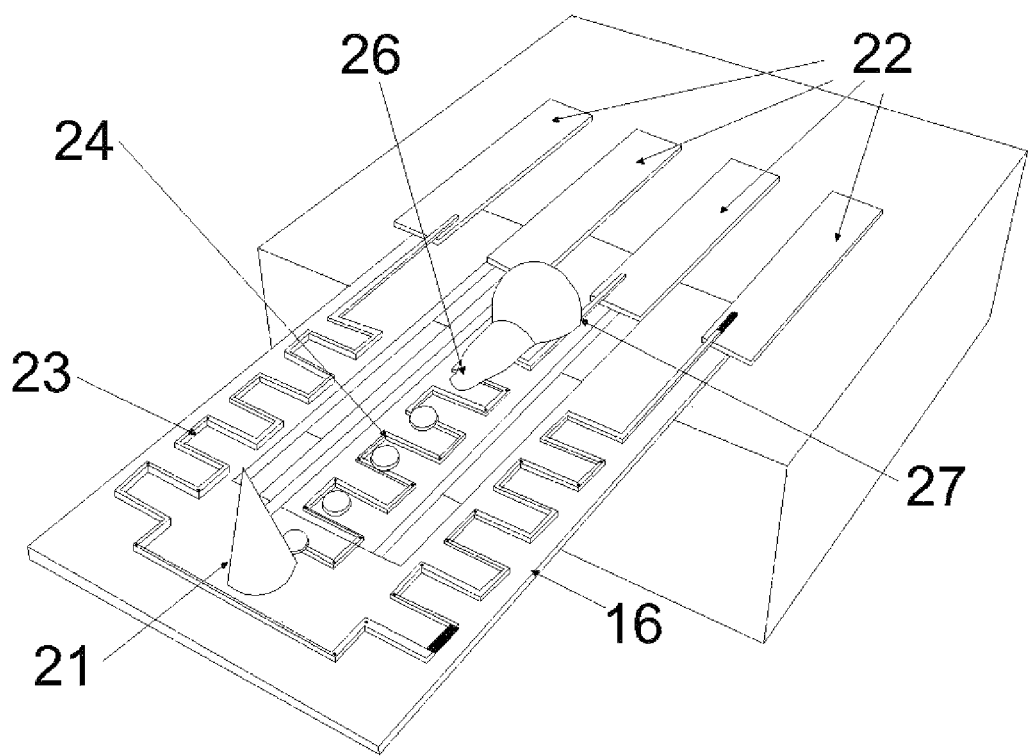
FIG. 2 is a schematic diagram of a three-arm thermal probe of the present disclosure.

As shown in FIG. 2, the present disclosure discloses a self-packing three-arm thermal probe for micro-nano manufacturing, which includes a three-arm cantilever beam 16, a metal contact pad 22, nichrome heating electrodes 23 for printing, a nichrome heating electrode 24 for transportation, and a polymer storage area 27. The three-arm cantilever beam 16 is E-shaped; two outer cantilever beams are printing cantilever beams, and middle cantilever beam is a transportation cantilever beam. A probe tip 21 is located in an area that connects the three cantilever beams and on an extending line of the transportation cantilever beam. The polymer storage area 27 is located at the other end of the transportation cantilever beam relative to the probe tip 21, the transportation cantilever beam is provided with the nichrome heating electrode 24 for transportation, which is distributed in an "S" shape, and is used for heating the polymer storage area 27. The nichrome heating electrode 24 for transportation is distributed to be more sparse from the polymer storage area 27 to the probe tip 21, thus forming a temperature gradient changing continuously from high to low along the transportation cantilever beam, so that a molten polymer 26 flows to the probe tip 21. The printing cantilever beams and the area that connects the three cantilever beams are provided with the nichrome heating electrode 23 for printings, which are uniformly distributed in an "S" shape, and are used for heating the probe tip 21, so that the polymer flowing to the probe tip 21 is kept in a liquid state for self-packing micro-nano printing. Four metal contact pads 22 in total are arranged on two sides of the three-arm cantilever beam 16 and in gaps among the three cantilever beams, and are used for supplying power to the heating electrodes. The two metal contact pads 22 on the two sides of the three-arm cantilever beam 16 are respectively connected to two ends of the nichrome heating electrode 23 for printing to form a loop; and the two metal contact pads 22 in the gaps among the three cantilever beams are respectively connected to two ends of the nichrome heating electrode 24 for transportation to form a loop.

Figure 3:
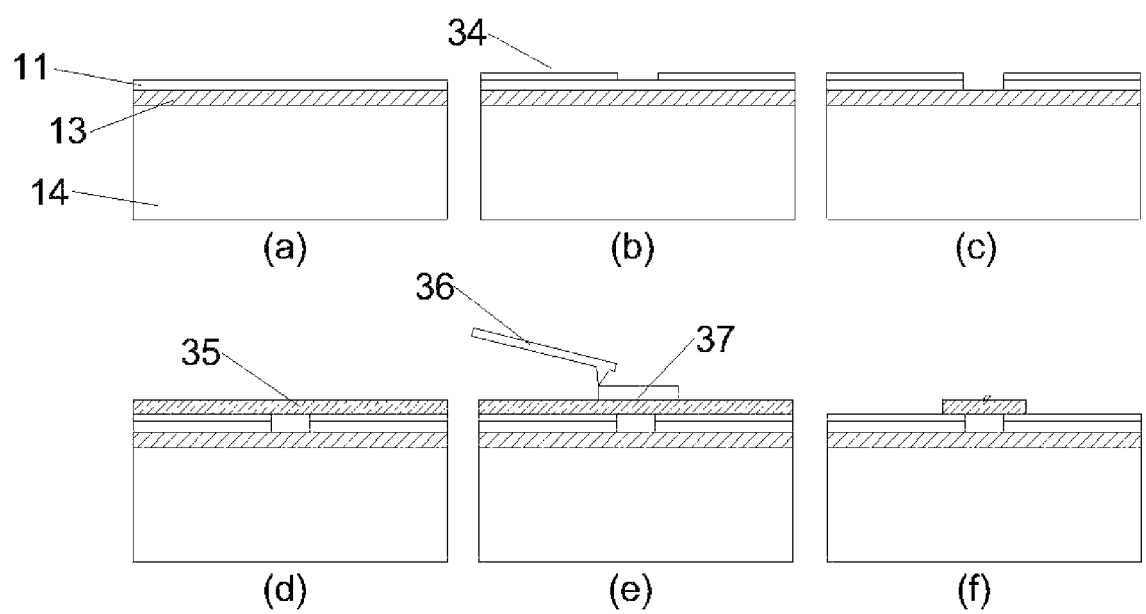
FIG. 3 is a schematic diagram of application of the present disclosure to nano printing.

FIG. 3 illustrates an application embodiment of the present disclosure in manufacturing silicon-based nano electromechanical devices of 100 nm or below and nano electromechanical devices of two-dimensional materials. Specific steps are as follows.

(3.1) As shown in FIG. 3(a), an SOI silicon wafer is used as a raw material; as shown in FIG. 3(b), lithography, electron beam evaporation, and photoresist lift-off technologies are sequentially performed on a surface of an SOI top-layer monocrystalline silicon 11 to manufacture a microscale metal electrode 34.

(3.2) As shown in FIG. 3(c), a part of a thin film of an SOI top-layer monocrystalline silicon 31 that is not protected by the metal electrode 34 is etched by an inductively coupled plasma (ICP) etching method.

(3.3) As shown in FIG. 3(d), a two-dimensional material is transferred to the surface of the SOI silicon wafer etched in the step (3.2).

(3.4) As shown in FIG. 3(e), a three-arm self-packing thermal probe 36 is used to print a polymer mask 37 of 100 nm on the etched part of the SOI silicon wafer.

(3.5) As shown in FIG. 3(f), the part of the two-dimensional material without polymer mask 37 is etched, and the polymer mask 37 on the surface is removed to obtain a suspended two-dimensional material nanobelt.

What is claimed is:

1. A self-packing three-arm thermal scanning probe for micro-nano manufacturing, comprising: a three-arm cantilever beam, metal contact pads, nichrome heating electrodes for printing, a nichrome heating electrode for transportation, and a polymer storage area, wherein the three-arm cantilever beam is E shape, two outer cantilever beams are printing cantilever beams, and middle cantilever beam is a transportation cantilever beam; a probe tip is located in an area that connects three cantilever beams and on an extending line of the transportation cantilever beam; the polymer storage area is located at an other end of the transportation cantilever beam relative to the probe tip; the transportation cantilever beam is provided with the nichrome heating electrode for transportation, exhibiting an S shape distribution, and is used for heating the polymer storage area; the nichrome heating electrode for transportation is distributed to become sparse from the polymer storage area to the probe tip, thus forming a temperature gradient continuously changing from high to low along the transportation cantilever beam, so that a molten polymer flows to the probe tip; the printing cantilever beams and the area that connects the three cantilever beams are provided with the nichrome heating electrode for printing, which are uniformly distributed in an S shape, and are used for heating the probe tip, so that the polymer flowing to the probe tip remains in a liquid state; four metal contact pads in total are arranged on two sides of the three-arm cantilever beam and in gaps among the three cantilever beams and are used for supplying power to the heating electrodes; two metal contact pads on the two sides of the three-arm cantilever beam are respectively connected to two ends of the nichrome heating electrode for printing to form a loop; and other two metal contact pads in the gaps of the three cantilever beams are respectively connected to two ends of the nichrome heating electrode for transportation to form a loop.

* * * * *